United States Patent
Yamada

(10) Patent No.: US 6,192,510 B1
(45) Date of Patent: Feb. 20, 2001

(54) METHOD OF PREPARING A PARTIAL ONE-SHOT ELECTRON BEAM EXPOSURE MASK AND METHOD OF DIRECT-WRITING PATTERNS BY USE OF A PARTIAL ONE-SHOT ELECTRON BEAM EXPOSURE MASK

(75) Inventor: Yasuhisa Yamada, Tokyo (JP)

(73) Assignee: Nec Corporation, Tokyo (JP)

( * ) Notice: Under 35 U.S.C. 154(b), the term of this patent shall be extended for 0 days.

(21) Appl. No.: 09/118,860

(22) Filed: Jul. 20, 1998

(30) Foreign Application Priority Data

Jul. 22, 1997 (JP) .................................................. 9-195616

(51) Int. Cl.$^7$ ............................. G06F 17/50; G06F 19/00; G21K 5/00
(52) U.S. Cl. ............................ 716/21; 700/120; 700/121; 378/35
(58) Field of Search ............................. 395/500.2–500.22; 716/19–21; 378/34–35; 700/120–121; 364/468.27–468.28

(56) References Cited

U.S. PATENT DOCUMENTS

| | | | |
|---|---|---|---|
| 4,744,047 | * 5/1988 | Okamoto et al. | 382/147 |
| 5,489,509 | * 2/1996 | Kawabata et al. | 430/5 |
| 5,546,225 | * 8/1996 | Shiraishi | 359/559 |
| 5,655,110 | * 8/1997 | Krivokapic et al. | 716/19 |
| 5,895,925 | * 4/1999 | Nakasuji | 250/492.22 |
| 6,004,701 | * 12/1999 | Uno et al. | 430/5 |

FOREIGN PATENT DOCUMENTS 9-97759   4/1997   (JP) .............................. H01L/21/027

OTHER PUBLICATIONS

Ito ("An automated system for LSI fine pattern inspection based on comparison of SEM images and CAD data", Proceedings of 1999 International Conference on Robotics and Automation, 1995, vol. 1, May 21 1995, pp. 544–549).*

Wani et al. ("Edge–region–based segmentation of range images", IEEE Transactions on Pattern Analysis and Machine Intelligence, vol. 16, No. 3, Mar. 1994, pp. 314–319).*

Mandlick et al. ("PC based image analyser for mask inspection", IEEE/CHMT International Electronic Manufacturing Technology Symposium, pp. 327–329A, Sep. 25, 1989).*

* cited by examiner

Primary Examiner—Matthew Smith
Assistant Examiner—Phallaka Kik
(74) Attorney, Agent, or Firm—Young & Thompson

(57) ABSTRACT

A method of extracting data of at least one aperture mask pattern from design data which includes write-required patterns and repeating units, so that boundary lines of the at least one aperture mask pattern are different from boundary lines of the repeating unit on the design data and so that the at least one aperture mask pattern completely includes at least one of the write-required patterns without partially or incompletely including the write-required pattern.

37 Claims, 10 Drawing Sheets

METHOD OF PREPARING A PARTIAL ONE-SHOT ELECTRON BEAM EXPOSURE MASK AND METHOD OF DIRECT-WRITING PATTERNS BY USE OF A PARTIAL ONE-SHOT ELECTRON BEAM EXPOSURE MASK

BACKGROUND OF THE INVENTION

The present invention relates to a method of preparing a partial one-shot electron beam exposure mask, and a method of direct-writing patterns by use of a partial one-shot electron beam exposure.

In recent years, a design rule requires a scaling down or downsizing of mask patterns to be used for a lithography. The lithography is classified into a photo-lithography, an X-ray lithography and an electron beam lithography. The X-ray lithography and the electron beam lithography are more attractive as the next generation lithography as being responsible for the scaling down or the downsizing in accordance with the requirement of the design rule. Further, a high throughput is required for manufacturing semiconductor devices. The high throughput is also required for the lithography for writing fine patterns on a resist over a wafer. A projection mode electron beam exposure has been proposed which uses an electron beam mask with fine patterns which are to be projected onto the resist over the wafer. This electron beam mask with some predetermined fine patterns is used for a partial one-shot of the electron beam. The partial one-shot electron beam mask has an aperture for a variable shaped electron beam exposure and some predetermined aperture patterns which, for example, correspond to contact hole patterns and line&space patterns. Such predetermined aperture patterns are extracted from device design data or computer aided design data. The predetermined aperture patterns of the mask constitute unit cells or structures which repeat a large number of times. This is disclosed in, for example, the Japanese laid-open patent publication No. 5-13313.

The mask for the partial one-shot direct-writing is prepared by use of CAD-data which have been prepared in a conventional method of preparation of the partial one-shot direct-writing mask data. The fine patterns are written by use of the mask prepared. If, however, the fine patterns are divided on the CAD-data, then the repeating unit cell or structure including the divided patterns is extracted for couductios a partial one-shot. This may cause a displacement between the partial one-shots or a deformation such as disconnection of the pattern. For example, as illustrated in FIG. 1, contact hole patterns are divided into repeating unit cells 1, each of which has a plurality of rectangles half-divided from the square-shaped control hole pattern for preparation of CAD-data 3. The repeating unit cell 1 is extracted from the CAD-data for forming an aperture pattern on a partial one-shot mask 2. For this reason, as illustrated in FIG. 2, there might be caused a disconnection "C" of the contact hole pattern or a displacement "D" between divided rectangular-shaped parts of the contact hole patter.

In the above circumstances, it had been required for conducting the electron beam partial one-shot direct-writing to optimize an extraction of partial one-shot mask data independently from the repeating unit cells on the CAD-data for preparing a mask in accordance with the extracted partial one-shot mask data so as to improve an accuracy of writing the pattern on the resist.

SUMMARY OF THE INVENTION

Accordingly, it is an object of the present invention to provide a novel method of preparing a partial one-shot electron beam exposure mask free from the above problems.

It is a further object of the present invention to provide a novel method of direct-writing patterns by use of a partial one-shot electron beam exposure.

One aspect of the present invention provides a method of extracting data of at least one aperture mask pattern from design data which include write-required patterns and repeating units, so that boundary lines of the at least one aperture mask pattern are different from boundary lines of the repeating unit on the design data and so that the at least one aperture mask pattern completely includes at least one of the write-required patterns without partially or incompletely including the write-required pattern, In the above aspect of the present invention, the data for forming the aperture mask pattern on the partial one-shot electron beam exposure mask are extracted from the design-data so that the aperture mask pattern is different from the repeating unit pattern on the design-data so that the aperture mask pattern includes complete write-required patterns only with no part of individual write-required patterns nor incomplete write-required patterns, thereby optimizing the extraction of the partial one-shot mask data independently from the repeating unit cells on the design-data for preparing a mask in accordance with the extracted partial one-shot mask data so as to improve an accuracy of writing the pattern on the resist.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
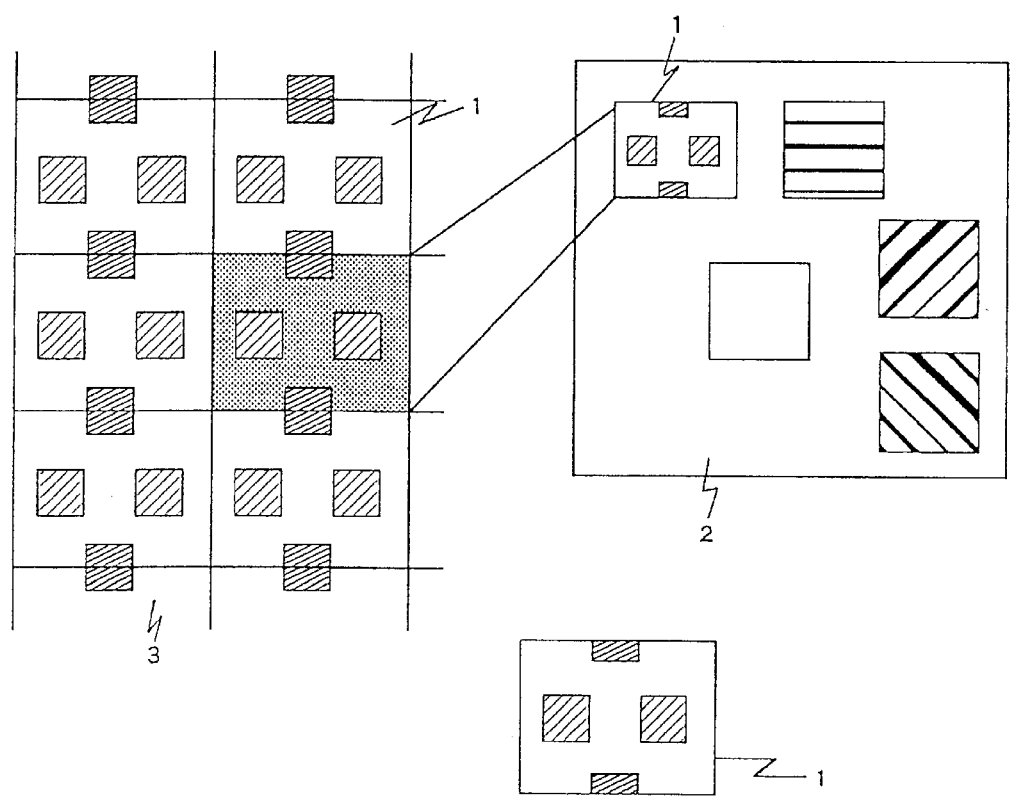
FIG. 1 is a plan view illustrative of the CAD-data and the conventional partial one-shot exposure mask with the conventional repeating unit cell extracted in the conventional method from the CAD-data.
Figure 2:
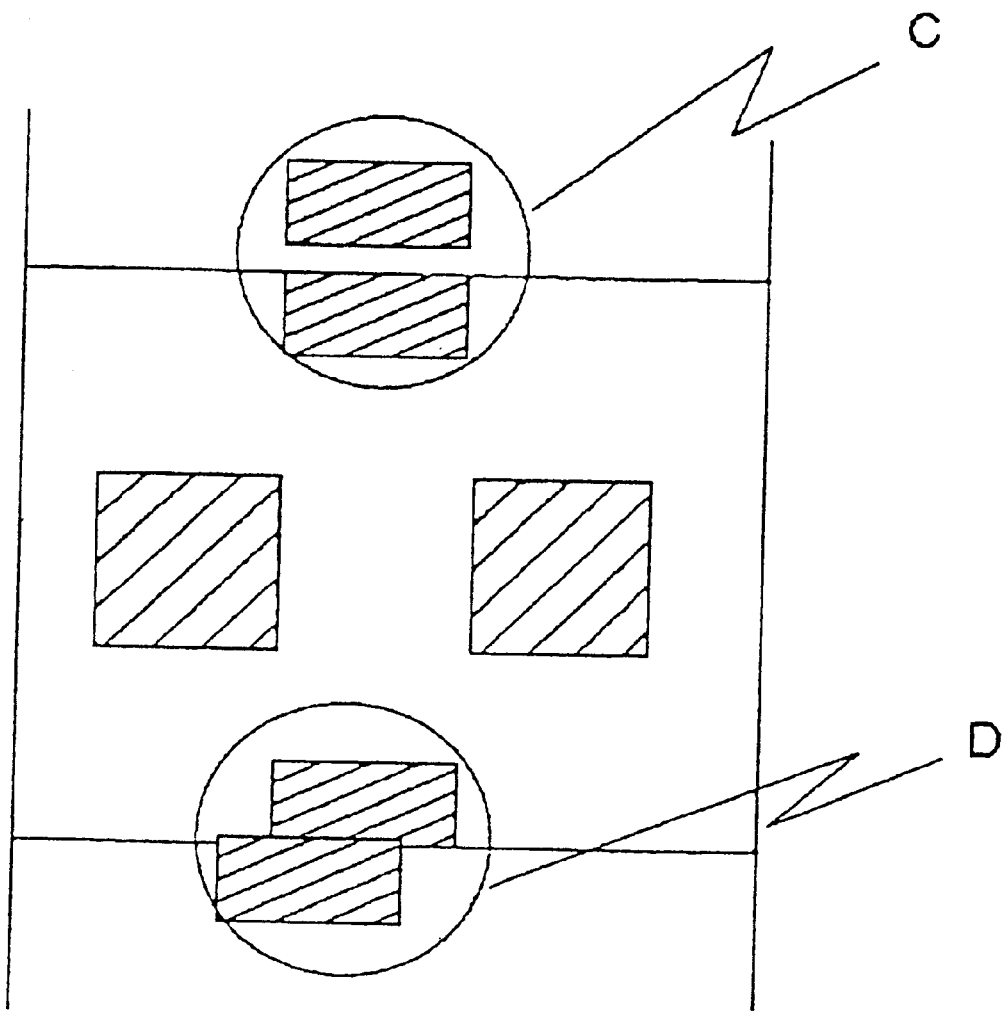
FIG. 2 is a plan view illustrative of patterns written on a resist by the conventional partial one-shot direct-writing method.

The first aspect of the present invention provides a method of extracting data of at least one aperture mask pattern from design data which include write-required patterns and repeating units, so that boundary lines of the at least one aperture mask pattern are different from boundary lines of the repeating unit on the design data and so that the at least one aperture mask pattern completely includes at least one of the write-required patterns without partially or incompletely including the write-required pattern.

It is preferable that the at least one aperture mask pattern has the same size as the repeating unit, and the at least one aperture mask pattern is shifted in position from the repeating unit.

It is also preferable that the at least one aperture mask pattern has a larger size than the repeating unit, and the boundary lines of the at least one aperture mask pattern are shifted in position from the repeating unit.

It is also preferable that the at least one aperture mask pattern has the same size as a unit block which includes a plurality of the repeating units, and the at least one aperture mask pattern is shifted in position from the unit block.

It is also preferable that the boundary lines of the at least one aperture mask pattern constitute a square, and the repeating unit has a square-shape.

In the above first aspect of the present invention, the data for forming the aperture mask pattern on the partial one-shot electron beam exposure mask are extracted from the design-data so that the aperture mask pattern is different from the repeating unit pattern on the design-data so that the aperture mask pattern includes complete write-required patterns only with no part of individual write-required patterns nor incomplete write-required patterns, thereby optimizing the extraction of the partial one-shot mask data independently from the repeating unit cells on the design-data for preparing a mask in accordance with the extracted partial one-shot mask data so as to improve an accuracy of writing the pattern on the resist.

The second aspect of the present invention provides a method of forming at least one aperture mask pattern on a partial one-shot charge-particle beam exposure mask. The method comprises the steps of: extracting data of at least one aperture mask pattern from design data which include write-required patterns and repeating units, so that boundary lines of the at least one aperture mask pattern are different from boundary lines of the repeating unit on the design data and so that the at least one aperture mask pattern completely includes at least one of the write-required patterns without partially or incompletely including the write-required pattern; and writing the at least one aperture mask pattern on the partial one-shot charge-particle beam exposure mask in accordance with the data extracted.

It is preferable that the at least one aperture mask pattern has the same size as the repeating unit, and the at least one aperture mask pattern is shifted in position from the repeating unit.

It is also preferable that the at least one aperture mask pattern has a larger size than the repeating unit, and the boundary lines of the at least one aperture mask pattern are shifted in position from the repeating unit.

It is also preferable that the at least one aperture mask pattern has the same size as a unit block which includes a plurality of the repeating units, and the at least one aperture mask pattern is shifted in position from the unit block.

It is also preferable that the boundary lines of the at least one aperture mask pattern constitute a square, and the repeating unit has a square-shape.

In the above second aspect of the present invention, the data for forming the aperture mask pattern on the partial one-shot electron beam exposure mask are extracted from the design-data so that the aperture mask pattern is different from the repeating unit pattern on the design-data so that the aperture mask pattern includes complete write-required patterns only with no part of individual write-required patterns nor incomplete write-required patterns, thereby optimizing the extraction of the partial one-shot mask data independently from the repeating unit cells on the design-data for preparing a mask in accordance with the extracted partial one-shot mask data so as to improve an accuracy of writing the pattern on the resist.

The third aspect of the present invention provides a method of preparing data for a partial one-shot unit based upon which a partial one-shot charge particle beam exposure is conducted. The method comprises a step of extracting data of at least one aperture mask pattern from design data which include write-required patterns and repeating units, so that boundary lines of the at least one aperture mask pattern are different from boundary lines of the repeating unit on the design data and so that the at least one aperture mask pattern completely includes at least one of the write-required patterns without partially or incompletely including the write-required pattern.

It is preferable that the at least one aperture mask pattern has the same size as the repeating unit, and the at least one aperture mask pattern is shifted in position from the repeating unit.

It is also preferable that the at least one aperture mask pattern has a larger size than the repeating unit, and the boundary lines of the at least one aperture mask pattern are shifted in position from the repeating unit.

It is also preferable that the at least one aperture mask pattern has the same size as a unit block which includes a plurality of the repeating units, and the at least one aperture mask pattern is shifted in position from the unit block.

It is also preferable that the boundary lines of the at least one aperture mask pattern constitute a square, and the repeating unit has a square-shape.

In the above third aspect of the present invention, the data for forming the aperture mask pattern on the partial one-shot electron beam exposure mask are extracted from the design-data so that the aperture mask pattern is different from the repeating unit pattern on the design-data so that the aperture mask pattern includes complete write-required patterns only with no part of individual write-required patterns nor incomplete write-required patterns, thereby optimizing the extraction of the partial one-shot mask data independently from the repeating unit cells on the design-data for preparing a mask in accordance with the extracted partial one-shot mask data so as to improve an accuracy of writing the pattern on the resist.

The fourth aspect of the present invention provides a data-extracting system for a partial one-shot charge particle beam exposure, wherein the data-extracting system is capable of extracting data of at least one aperture mask pattern from design data which include write-required patterns and repeating units, so that boundary lines of the at least one aperture mask pattern are different from boundary lines of the repeating unit on the design data and so that the at least one aperture mask pattern completely includes at least one of the write-required patterns without partially or incompletely including the write-required pattern.

It is preferable that the at least one aperture mask pattern has the same size as the repeating unit, and the at least one aperture mask pattern is shifted in position from the repeating unit.

It is also preferable that the at least one aperture mask pattern has a larger size than the repeating unit, and the boundary lines of the at least one aperture mask pattern are shifted in position from the repeating unit.

It is also preferable that the at least one aperture mask pattern has the same size as a unit block which includes a plurality of the repeating units, and the at least one aperture mask pattern is shifted in position from the unit block.

It is also preferable that the boundary lines of the at least one aperture mask pattern constitute a square, and the repeating unit has a square-shape.

In the above fourth aspect of the present invention, the data for forming the aperture mask pattern on the partial one-shot electron beam exposure mask are extracted from the design-data so that the aperture mask pattern is different from the repeating unit pattern on the design-data so that the aperture mask pattern includes complete write-required patterns only with no part of individual write-required patterns nor incomplete write-required patterns, thereby optimizing the extraction of the partial one-shot mask data independently from the repeating unit cells on the design-data for preparing a mask in accordance with the extracted partial one-shot mask data so as to improve an accuracy of writing the pattern on the resist.

The fifth aspect of the present invention provides a data-preparing system for a partial one-shot unit based upon which a partial one-shot charge particle beam exposure is conducted, wherein the data-preparing system is capable of extracting data of at least one aperture mask pattern from design data which include write-required patterns and repeating units, so that boundary lines of the at least one aperture mask pattern are different from boundary lines of the repeating unit on the design data and so that the at least one aperture mask pattern completely includes at least one of the write-required patterns without partially or incompletely including the write-required pattern.

It is preferable that the at least one aperture mask pattern has the same size as the repeating unit, and the at least one aperture mask pattern is shifted in position from the repeating unit.

It is also preferable that the at least one aperture mask pattern has a larger size than the repeating unit, and the boundary lines of the at least one aperture mask pattern are shifted in position from the repeating unit.

It is also preferable that the at least one aperture mask pattern has the same size as a unit block which includes a plurality of the repeating units, and the at least one aperture mask pattern is shifted in position from the unit block.

It is also preferable that the boundary lines of the at least one aperture mask pattern constitute a square, and the repeating unit has a square-shape.

In the above fifth aspect of the present invention, the data for forming the aperture mask pattern on the partial one-shot electron beam exposure mask are extracted from the design-data so that the aperture mask pattern is different from the repeating unit pattern on the design-data so that the aperture mask pattern includes complete write-required patterns only with no part of individual write-required patterns nor incomplete write-required patterns, thereby optimizing the extraction of the partial one-shot mask data independently from the repeating unit cells on the design-data for preparing a mask in accordance with the extracted partial one-shot mask data so as to improve an accuracy of writing the pattern on the resist.

The sixth aspect of the present invention provides a storage medium which stores a computer-program for a data-extracting process for a partial one-shot charge particle beam exposure, wherein the data-extracting process comprises a step of extracting data of at least one aperture mask pattern from design data which include write-required patterns and repeating units, so that boundary lines of the at least one aperture mask pattern are different from boundary lines of the repeating unit on the design data and so that the at least one aperture mask pattern completely includes at least one of the write-required patterns without partially or incompletely including the write-required pattern.

It is preferable that the at least one aperture mask pattern has the same size as the repeating unit, and the at least one aperture mask pattern is shifted in position from the repeating unit.

It is also preferable that the at least one aperture mask pattern has a larger size than the repeating unit, and the boundary lines of the at least one aperture mask pattern are shifted in position from the repeating unit.

It is also preferable that the at least one aperture mask pattern has the same size as a unit block which includes a plurality of the repeating units, and the at least one aperture mask pattern is shifted in position from the unit block.

It is also preferable that the boundary lines of the at least one aperture mask pattern constitute a square, and the repeating unit has a square-shape.

In the above sixth aspect of the present invention, the data for forming the aperture mask pattern on the partial one-shot electron beam exposure mask are extracted from the design-data so that the aperture mask pattern is different from the repeating unit pattern on the design-data so that the aperture mask pattern includes complete write-required patterns only with no part of individual write-required patterns nor incomplete write-required patterns, thereby optimizing the extraction of the partial one-shot mask data independently from the repeating unit cells on the design-data for preparing a mask in accordance with the extracted partial one-shot mask data so as to improve an accuracy of writing the pattern on the resist.

The seventh aspect of the present invention provides a storage medium which stores a computer-program for defining a partial one-shot unit based upon which a partial one-shot charge particle beam exposure is conducted, wherein the computer-program includes a process of extracting data of at least one aperture mask pattern from design data which include writerequired patterns and repeating units, so that boundary lines of the at least one aperture mask pattern are different from boundary lines of the repeating unit on the design data and so that the at least one aperture mask pattern completely includes at least one of the write-required patterns without partially or incompletely including the write-required pattern.

It is preferable that the at least one aperture mask pattern has the same size as the repeating unit, and the at least one aperture mask pattern is shifted in position from the repeating unit.

It is also preferable that the at least one aperture mask pattern has a larger size than the repeating unit, and the boundary lines of the at least one aperture mask pattern are shifted in position from the repeating unit.

It is also preferable that the at least one aperture mask pattern has the same size as a unit block which includes a plurality of the repeating units, and the at least one aperture mask pattern is shifted in position from the unit block.

It is also preferable that the boundary lines of the at least one aperture mask pattern constitute a square, and the repeating unit has a square-shape.

In the above seventh aspect of the present invention, the data for forming the aperture mask pattern on the partial one-shot electron beam exposure mask are extracted from the design-data so that the aperture mask pattern is different from the repeating unit pattern on the design-data so that the aperture mask pattern includes complete write-required patterns only with no part of individual write-required patterns nor incomplete write-required patterns, thereby optimizing the extraction of the partial one-shot mask data independently from the repeating unit cells on the design-data for preparing a mask in accordance with the extracted partial one-shot mask data so as to improve an accuracy of writing the pattern on the resist.

Figure 3:
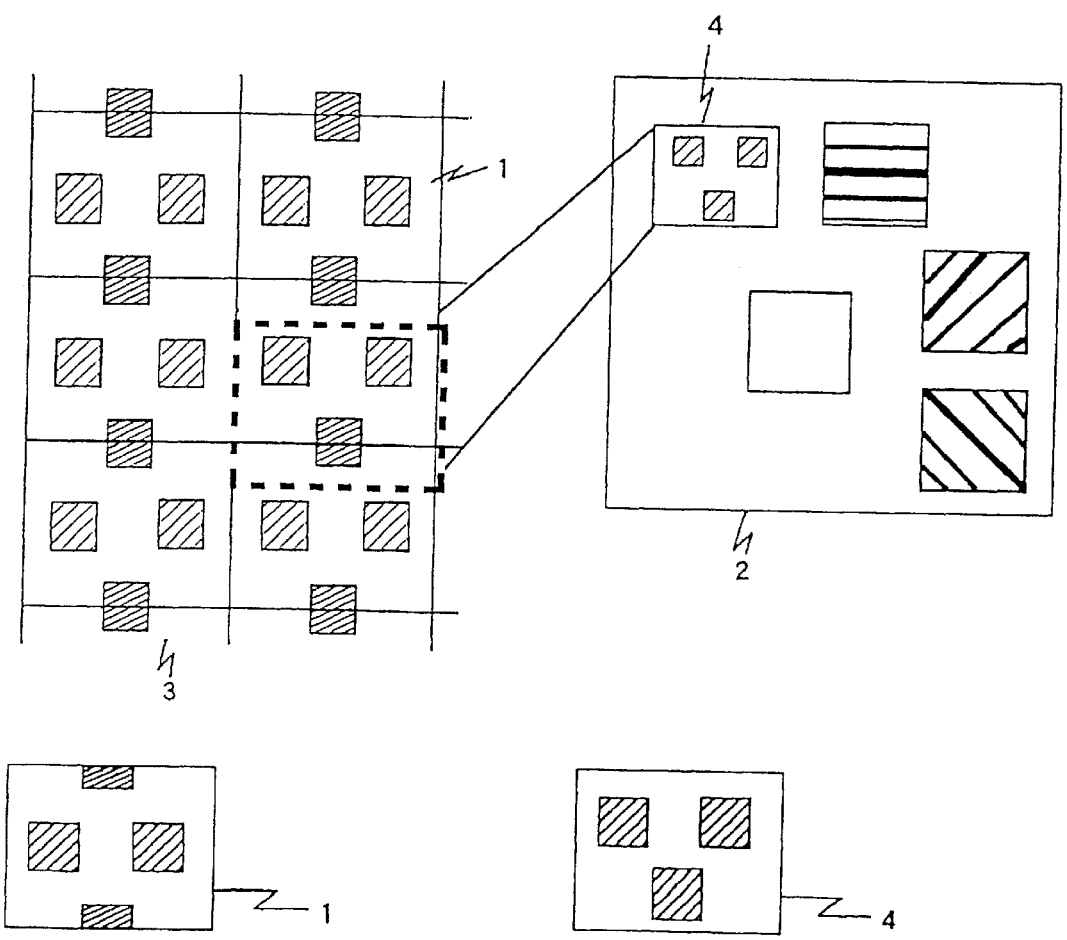
FIG. 3 is a plan view illustrative of CAD-data and a novel partial one-shot exposure mask with a novel repeating unit cell extracted in a novel method from the CAD-data in a first embodiment in accordance with the present invention.
Figure 4:
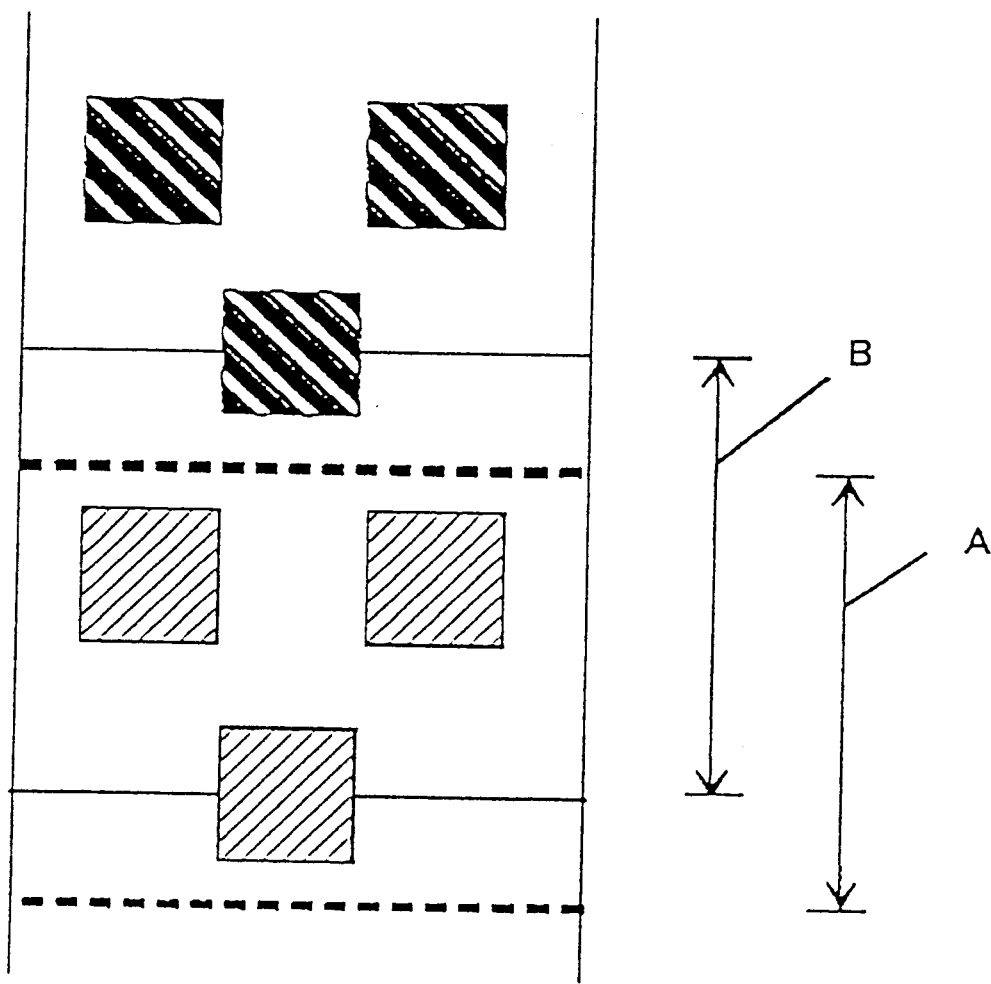
FIG. 4 is a plan view illustrative of patterns written on a resist by a novel partial one-shot direct-writing method in a first embodiment in accordance with the present invention.

A first embodiment according to the present invention will be described in detail with reference to FIG. 3. CAD-data has a large number of repeating unit patterns 1, each of which is square-shaped and represented by real lines. Each of the repeating unit patterns 1 on the CAD-data 3 includes two complete square-shaped contact hole patterns and two half-divided contact hole patterns. Data for forming an aperture mask pattern 4 on a partial one-shot exposure mask 2 are extracted from the CAD-data. The aperture mask pattern 4 is square-shaped which has the same size as the repeating unit patterns 1 but displaced in position from the repeating unit patterns 1 on the CAD-data, whereby the aperture mask pattern 4 includes three complete square-shaped contact hole patterns with neither divided contact hole pattern nor incomplete contact hole pattern. The aperture mask pattern 4 has a position which is defined by broad broken lines. The aperture mask pattern 4 is formed on the partial one-shot exposure mask 2 in accordance with the extracted data of the aperture mask pattern 4 from the CAD-data. No change is made to the repeating unit patterns 1 on the CAD-data. As described above, the aperture mask pattern 4 is extracted from the CAD-data 3 so that the aperture mask pattern 4 is shifted in position or displaced from the repeating unit pattern 1 on the CAD-data. For this reason, it is necessary to shift or displace a position of a partial one-shot electron beam exposure unit "A" from the position of the repeating unit pattern "B" as illustrated in FIG. 4 in accordance with the shift or displacement in extraction of data for the aperture mask pattern 4 from the repeating unit pattern 1 on the CAD-data.

In the above first embodiment, the data for forming the aperture mask pattern on the partial one-shot electron beam exposure mask are extracted from the CAD-data so that the aperture mask pattern is different from the repeating unit pattern on the CAD-data so that the aperture mask pattern includes complete write-required patterns only with no part of individual write-required patterns nor incomplete write-required patterns, thereby optimizing the extraction of the partial one-shot mask data independently from the repeating unit cells on the CAD-data for preparing a mask in accordance with the extracted partial one-shot mask data so as to improve an accuracy of writing the pattern on the resist.

Figure 5:
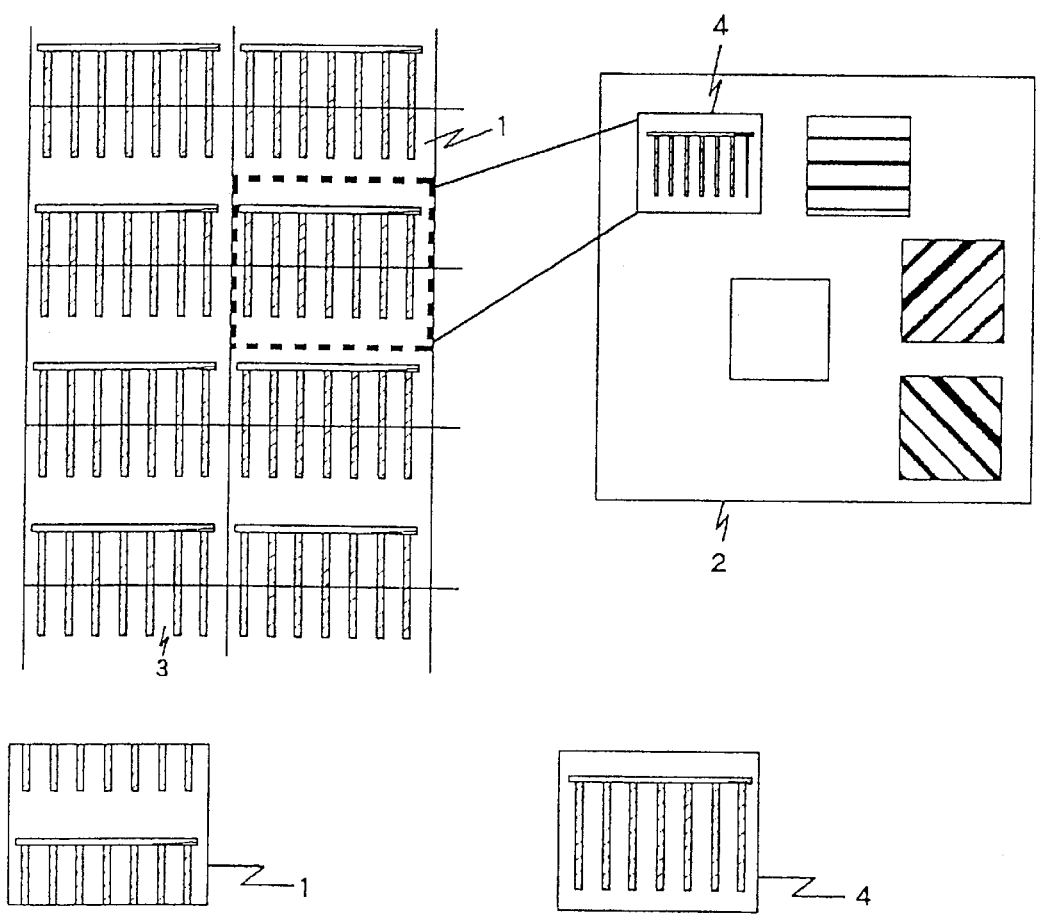
FIG. 5 is a plan view illustrative of CAD-data and a novel partial one-shot exposure mask with a novel repeating unit cell extracted in a novel method from the CAD-data in a second embodiment in accordance with the present invention.
Figure 6:
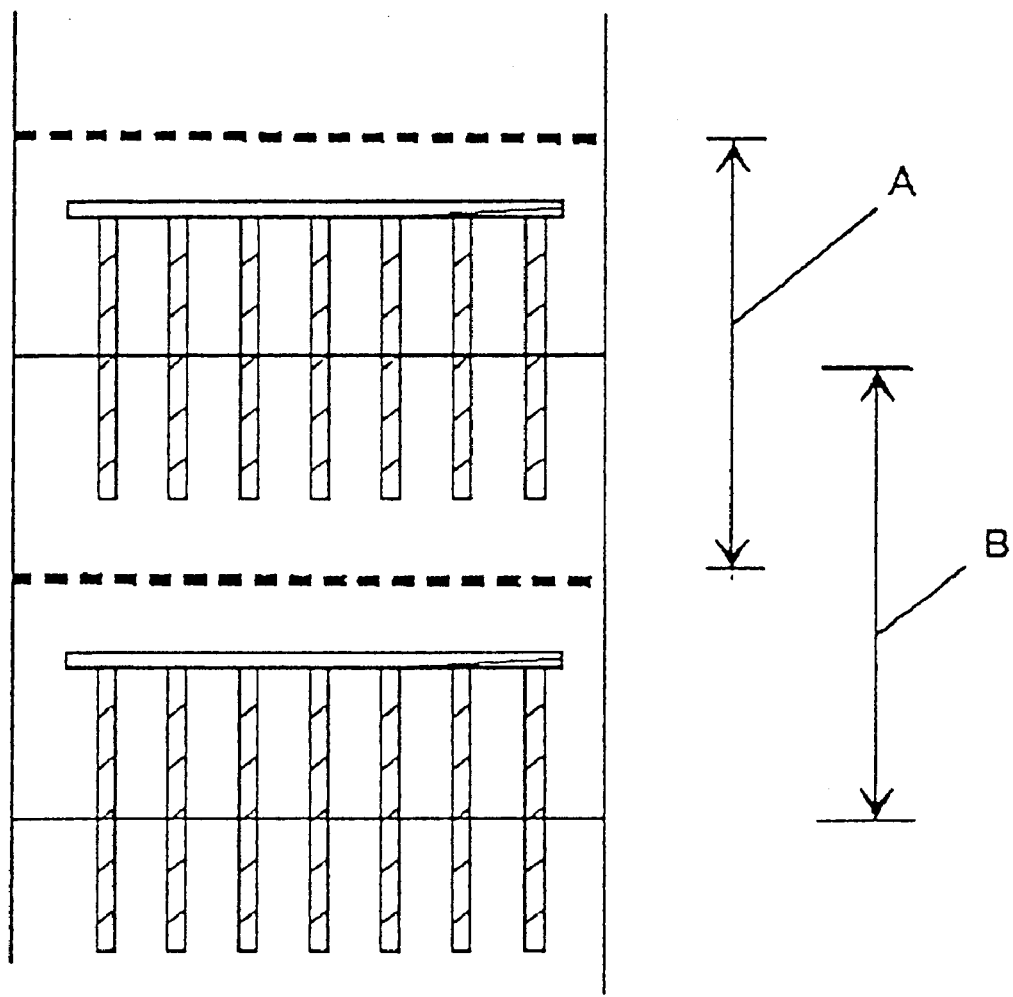
FIG. 6 is a plan view illustrative of patterns written on a resist by a novel partial one-shot direct-writing method in a second embodiment in accordance with the present invention.

A second embodiment according to the present invention will be described in detail with reference to FIG. 5. CAD-data has a large number of repeating unit patterns 1, each of which is square-shaped and represented by real lines. Each of the repeating unit patterns 1 on the CAD-data 3 includes two incomplete line-patterns. Data for forming an aperture mask pattern 4 on a partial one-shot exposure mask 2 are extracted from the CAD-data. The aperture mask pattern 4 is square-shaped which has the same size as the repeating unit patterns 1 but displaced in position from the repeating unit patterns 1 on the CAD-data, whereby the aperture mask pattern 4 includes a single complete line-pattern with no divided line-pattern nor incomplete divided line-pattern. The aperture mask pattern 4 has a position which is defined by broad broken lines. The aperture mask pattern 4 is formed on the partial one-shot exposure mask 2 in accordance with the extracted data of the aperture mask pattern 4 from the CAD-data. No change is made to the repeating unit patterns 1 on the CAD-data. As described above, the aperture mask pattern 4 is extracted from the CAD-data 3 so that the aperture mask pattern 4 is shifted in position or displaced from the repeating unit pattern 1 on the CAD-data. For this reason, it is necessary to shift or displace a position of a partial one-shot electron beam exposure unit "A" from the position of the repeating unit pattern "B" as illustrated in FIG. 6 in accordance with the shift or displacement in extraction of data for the aperture mask pattern 4 from the repeating unit pattern 1 on the CAD-data.

In the above second embodiment, the data for forming the aperture mask pattern on the partial one-shot electron beam exposure mask are extracted from the CAD-data so that the aperture mask pattern is different from the repeating unit pattern on the CAD-data so that the aperture mask pattern includes complete write-required patterns only with no part of individual write-required patterns nor incomplete write-required patterns, thereby optimizing the extraction of the partial one-shot mask data independently from the repeating unit cells on the CAD-data for preparing a mask in accordance with the extracted partial one-shot mask data so as to improve an accuracy of writing the pattern on the resist.

Figure 7:
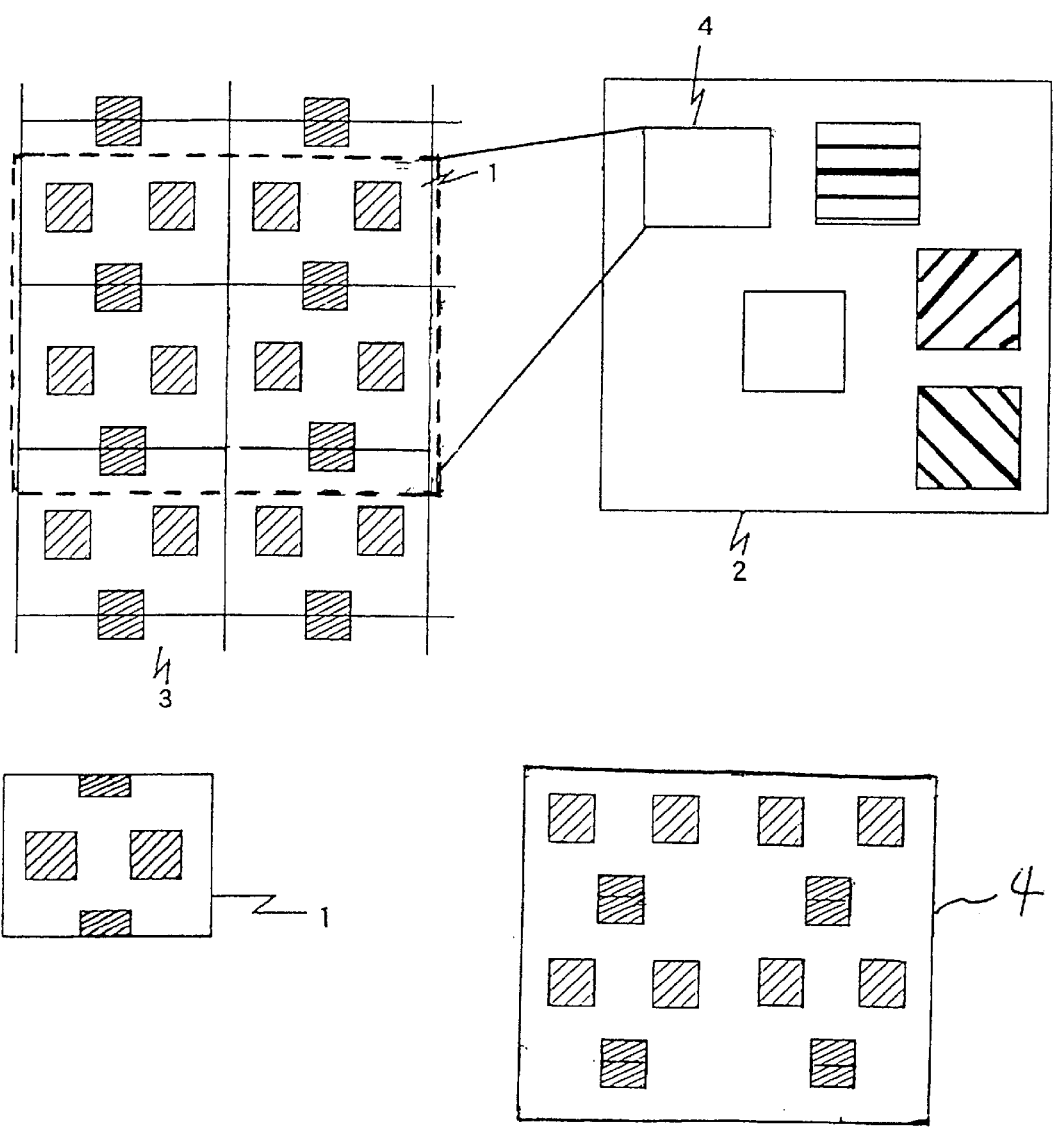
FIG. 7 is a plan view illustrative of CAD-data and a novel partial one-shot exposure mask with a novel repeating unit cell extracted in a novel method from the CAD-data in a third embodiment in accordance with the present invention.
Figure 8:
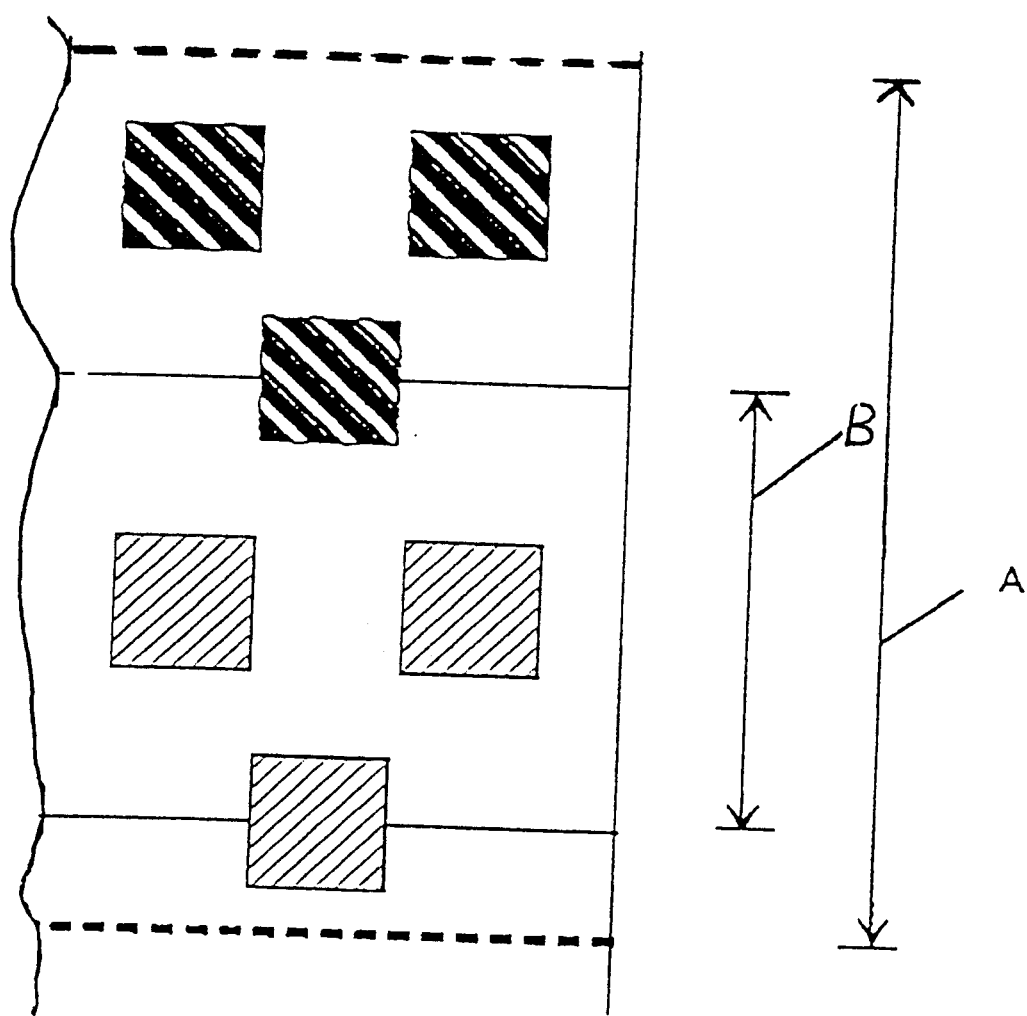
FIG. 8 is a plan view illustrative of patterns written on a resist by a novel partial one-shot direct-writing method in a third embodiment in accordance with the present invention.

A third embodiment according to the present invention will be described in detail with reference to FIG. 7. CAD-data has a large number of repeating unit patterns 1, each of which is square-shaped and represented by real lines. Each of the repeating unit patterns 1 on the CAD-data 3 includes two complete square-shaped contact hole patterns and two half-divided contact hole patterns. Data for forming an aperture mask pattern 4 on a partial one-shot exposure mask 2 are extracted from the CAD-data. The aperture mask pattern 4 is square-shaped which has a larger size by four times in area than the repeating unit patterns 1. However, boundary lines of the aperture mask pattern 4 are displaced in position from the boundary lines of the repeating unit patterns 1 on the CAD-data, whereby the aperture mask pattern 4 includes twelve complete square-shaped contact hole patterns with no divided contact hole pattern nor incomplete contact hole pattern. The aperture mask pattern 4 has a position which is defined by broad broken lines. The aperture mask pattern 4 is formed on the partial one-shot exposure mask 2 in accordance with the extracted data of the aperture mask pattern 4 from the CAD-data. No change is made to the repeating unit patterns 1 on the CAD-data. As described above, the aperture mask pattern 4 is extracted from the CAD-data 3 so that the aperture mask pattern 4 is shifted in position or displaced from the repeating unit pattern 1 on the CAD-data. For this reason, it is necessary to shift or displace a position of boundary liens of a partial one-shot electron beam exposure unit "A" from boundary lines of the position of the repeating unit pattern "B" as illustrated in FIG. 8 in accordance with the shift or displacement in extraction of data for the aperture mask pattern 4 from the repeating unit pattern 1 on the CAD-data.

In the above third embodiment, the data for forming the aperture mask pattern on the partial one-shot electron beam exposure mask are extracted from the CAD-data so that the aperture mask pattern is different from the repeating unit pattern on the CAD-data so that the aperture mask pattern includes complete write-required patterns only with no part of individual write-required patterns nor incomplete write-required patterns, thereby optimizing the extraction of the partial one-shot mask data independently from the repeating unit cells on the CAD-data for preparing a mask in accordance with the extracted partial one-shot mask data so as to improve an accuracy of writing the pattern on the resist.

Figure 9:
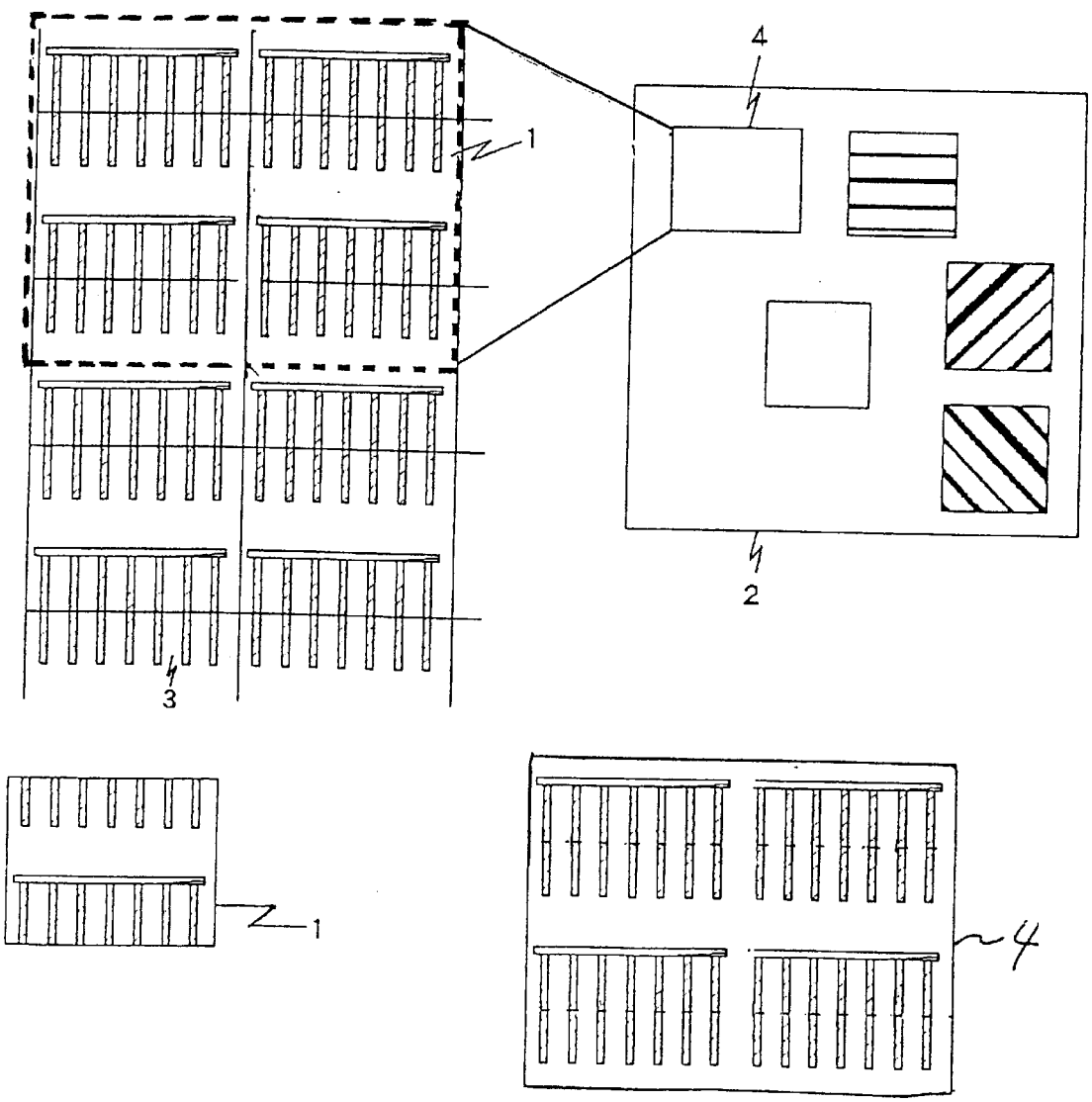
FIG. 9 is a plan view illustrative of CAD-data and a novel partial one-shot exposure mask with a novel repeating unit cell extracted in a novel method from the CAD-data in a fourth embodiment in accordance with the present invention.
Figure 10:
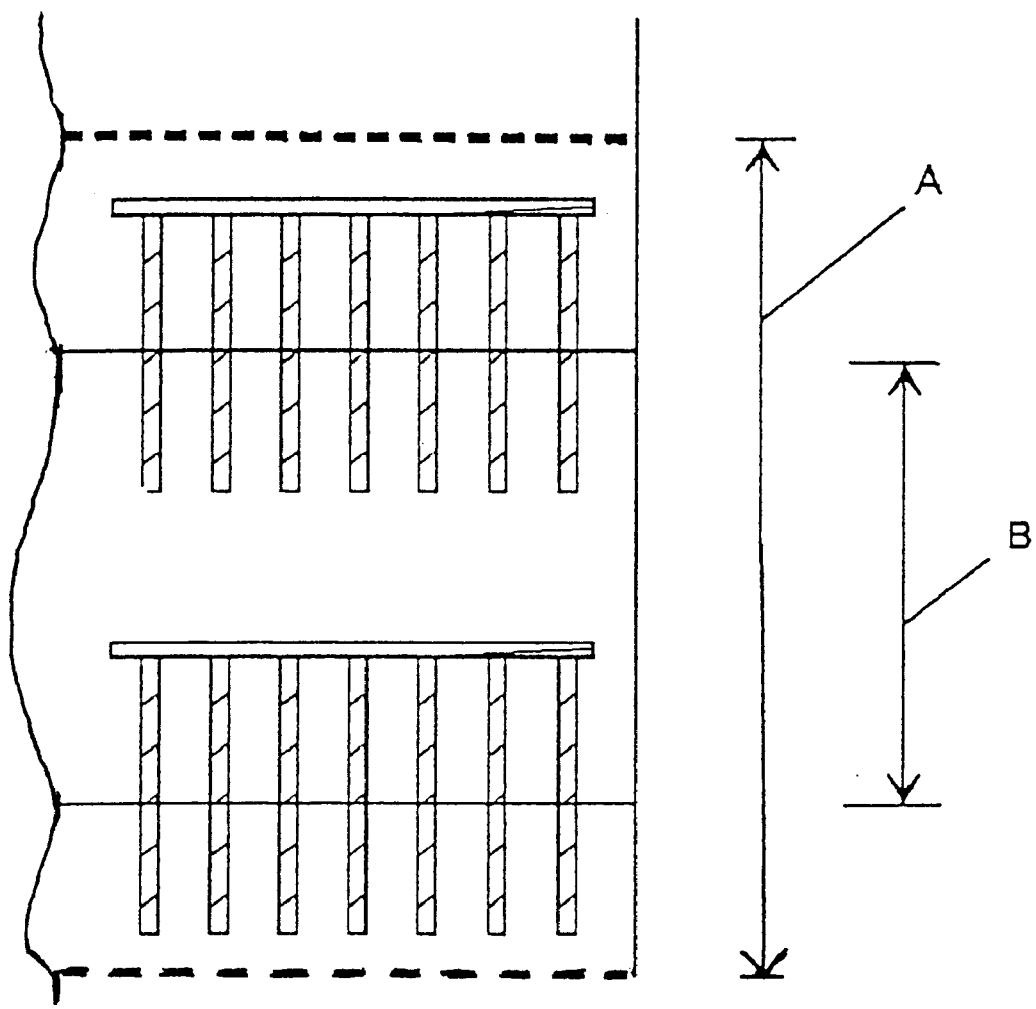
FIG. 10 is a plane view illustrative of patterns written on a resist by a novel partial one-shot direct-writing method in a fourth embodiment in accordance with the present invention.

A fourth embodiment according to the present invention will be described in detail with reference to FIG 9. CAD-data has a large number of repeating unit patterns 1, each of which is square-shaped and represented by real lines. Each of the repeating unit patterns 1 on the CAD-data 3 includes two incomplete line-patterns. Data for forming an aperture mask pattern 4 on a partial one-shot exposure mask 2 are extracted from the CAD-data. The aperture mask pattern 4 is square-shaped which has a larger size by four times in area as the repeating unit patterns 1 but boundary lines of the aperture mask pattern 4 are displaced in position from the boundary lines of the repeating unit patterns 1 on the CAD-data, whereby the aperture mask pattern 4 includes four complete line-patterns with no divided line-pattern nor incomplete divided line-pattern. The aperture mask pattern 4 has a position which is defined by broad broken lines. The aperture mask pattern 4 is formed on the partial one-shot exposure mask 2 in accordance with the extracted data of the aperture mask pattern 4 from the CAD-data. No change is made to the repeating unit patterns 1 on the CAD-data. As described above, the aperture mask pattern 4 is extracted from the CAD-data 3 so that the boundary lines of the aperture mask pattern 4 are shifted in position or displaced from the boundary lines of the repeating unit pattern 1 on the CAD-data. For this reason, it is necessary to shift or displace a position of a partial one-shot electron beam exposure unit "A" from the position of the repeating unit pattern "B" as illustrated in FIG. 10 in accordance with the shift or displacement in extraction of data for the aperture mask pattern 4 from the repeating unit pattern 1 on the CAD-data.

In the above fourth embodiment, the data for forming the aperture mask pattern on the partial one-shot electron beam exposure mask are extracted from the CAD-data so that the aperture mask pattern is different from the repeating unit pattern on the CAD-data so that the aperture mask pattern includes complete write-required patterns only with no part of individual write-required patterns nor incomplete write-required patterns, thereby optimizing the extraction of the partial one-shot mask data independently from the repeating unit cells on the CAD-data for preparing a mask in accordance with the extracted partial one-shot mask data so as to improve an accuracy of writing the pattern on the resist.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of extracting data of at least one aperture mask pattern from design data which include write-required patterns and repeating units, so that boundary lines of said at least one aperture mask pattern are different from boundary lines of said repeating unit on said design data and so that said at least one aperture mask pattern completely includes at least one of said write-required patterns without partially or incompletely including said write-required pattern, said at least one aperture mask pattern being shifted in position from said repeating unit to compensate the difference in boundary lines between said at least one aperture mask and said repeating unit, and said method extracts the data of said at least one aperture mask.

2. The method as claimed in claim 1, wherein said at least one aperture mask pattern has the same size as said repeating unit.

3. The method as claimed in claim 1, wherein said at least one aperture mask pattern has a larger size than said repeating unit.

4. The method as claimed in claim 3, wherein said at least one aperture mask pattern has the same size as a unit block which includes a plurality of said repeating units, and said at least one aperture mask pattern is shifted in position from said unit block.

5. The method as claimed in claim 1, wherein said boundary lines of said at least one aperture mask pattern constitute a square, and said repeating unit has a square-shape.

6. A method of forming at least one aperture mask pattern on a partial one-shot charge-particle beam exposure mask, said method comprising the steps of:

extracting data of at least one aperture mask pattern from design data which include write-required patterns and repeating units, so that boundary lines of said at least one aperture mask pattern are different from boundary lines of said repeating unit on said design data and so that said at least one aperture mask pattern completely includes at least one of said write-required patterns without partially or incompletely including said write-required pattern, said at least one aperture mask pattern being shifted in position from said repeating unit to compensate the difference in boundary lines between said at least one aperture mask and said repeating unit; and writing said at least one aperture mask pattern on said partial one-shot charge-particle beam exposure mask in accordance with said data extracted.

7. The method as claimed in claim 6, wherein said at least one aperture mask pattern has the same size as said repeating unit.

8. The method as claimed in claim 6, wherein said at least one aperture mask pattern has a larger size than said repeating unit.

9. The method as claimed in claim 8, wherein said at least one aperture mask pattern has the same size as a unit block which includes a plurality of said repeating units, and said at least one aperture mask pattern is shifted in position from said unit block.

10. The method as claimed in claim 6, wherein said boundary lines of said at least one aperture mask pattern constitute a square, and said repeating unit has a square-shape.

11. A data-extracting system for a partial one-shot charge particle beam exposure, wherein said data-extracting system is capable of extracting data of at least one aperture mask pattern from design data which include write-required patterns and repeating units, so that boundary lines of said at least one aperture mask pattern are different from boundary lines of said repeating unit on said design data and so that said at least one aperture mask pattern completely includes at least one of said write-required patterns without partially or incompletely including said write-required pattern, said at least one aperture mask pattern being shifted in position from said repeating unit to compensate the difference in boundary lines between said at least one aperture mask and said repeating unit, and said system extracts the data of said at least one aperture mask.

12. The data-extracting system as claimed in claim 11, wherein said at least one aperture mask pattern has the same size as said repeating unit.

13. The data-extracting system as claimed in claim 12, wherein said at least one aperture mask pattern has a larger size than said repeating unit.

14. The data-extracting system as claimed in claim 13, wherein said at least one aperture mask pattern has the same size as a unit block which includes a plurality of said repeating units, and said at least one aperture mask pattern is shifted in position from said unit block.

15. The data-extracting system as claimed in claim 11, wherein said boundary lines of said at least one aperture mask pattern constitute a square, and said repeating unit has a square-shape.

16. A storage medium which stores a computer-program for a data-extracting process for a partial one-shot charge particle beam exposure, wherein said data-extracting process comprises a step of extracting data of at least one aperture mask pattern from design data which include write-required patterns and repeating units, so that boundary lines of said at least one aperture mask pattern are different from boundary lines of said repeating unit on said design data and so that said at least one aperture mask pattern completely includes at least one of said write-required patterns without partially or incompletely including said write-required pattern, said at least one aperture mask pattern being shifted in position from said repeating unit to compensate the difference in boundary lines between said at least one aperture mask and said repeating unit.

17. The storage medium as claimed in claim 16, wherein said at least one aperture mask pattern has the same size as said repeating unit.

18. The storage medium as claimed in claim 16, wherein said at least one aperture mask pattern has a larger size than said repeating unit.

19. The storage medium as claimed in claim 18, wherein said at least one aperture mask pattern has the same size as a unit block which includes a plurality of said repeating units, and said at least one aperture mask pattern is, shifted in position from said unit block.

20. The storage medium as claimed in claim 16, wherein said boundary lines of said at least one aperture mask pattern constitute a square, and said repeating unit has a square-shape.

21. A storage medium which stores a computer-program for defining a partial one-shot unit based upon which a partial one-shot charge particle beam exposure is conducted, wherein said computer-program includes a process of extracting data of at least one aperture mask pattern from design data which include write-required patterns and repeating units, so that boundary lines of said at least one aperture mask pattern are different from boundary lines of said repeating unit on said design data and so that said at least one aperture mask pattern completely includes at least one of said write-required patterns without partially or incompletely including said write-required pattern, said at least one aperture mask pattern being shifted in position from said repeating unit to compensate the difference in boundary lines between said at least one aperture mask and said repeating unit.

22. The storage medium as claimed in claim 21, wherein said at least one aperture mask pattern has the same size as said repeating unit.

23. The storage medium as claimed in claim 21, wherein said at least one aperture mask pattern has a larger size than said repeating unit.

24. The storage medium as claimed in claim 23, wherein said at least one aperture mask pattern has the same size as a unit block which includes a plurality of said repeating units, and said at least one aperture mask pattern is shifted in position from said unit block.

25. The storage medium as claimed in claim 21, wherein said boundary lines of said at least one aperture mask pattern constitute a square, and said repeating unit has a square-shape.

26. A method of extracting data from mask design data, the extracted data being used to form a partial one shot exposure mask, the method comprising the steps of:
  providing mask design data that includes a repeating unit pattern that includes an incomplete circuit element pattern, the repeating unit pattern being arranged so that the incomplete circuit element pattern would be completed if plural of the repeating unit pattern were to adjoin one another; and
  extracting data from the mask design data to define an aperture mask pattern for the partial one shot exposure mask by shifting a position of the aperture mask pattern relative to the repeating unit pattern, wherein boundary lines of the aperture mask pattern are arranged so that all of the circuit element patterns in the aperture mask pattern are complete.

27. The method of claim 26, wherein the repeating unit pattern and the aperture mask pattern have the same peripheral shape.

28. The method of claim 27, wherein the repeating unit pattern and the aperture mask pattern are square.

29. The method of claim 27, wherein the repeating unit pattern and the aperture mask pattern have the same size.

30. The method of claim 26, wherein the repeating unit pattern is smaller than the aperture mask pattern.

31. The method of claim 30, wherein the aperture mask pattern includes a plurality of the repeating unit patterns.

32. A method of making a partial one shot exposure mask from mask design data, the method comprising the steps of:
  providing mask design data that includes a repeating unit pattern that includes an incomplete circuit element pattern, the repeating unit pattern being arranged so that the incomplete circuit element pattern would be completed if plural of the repeating unit pattern were to adjoin one another;
  extracting data from the mask design data to define an aperture mask pattern for the partial one shot exposure mask by shifting a position of the aperture mask pattern relative to the repeating unit pattern, wherein boundary lines of the aperture mask pattern are arranged so that all of the circuit element patterns in the aperture mask pattern are complete; and
  forming the partial one shot exposure mask that includes the aperture mask pattern.

33. The method of claim 32, wherein the repeating unit pattern and the aperture mask pattern have the same peripheral shape.

34. The method of claim 33, wherein the repeating unit pattern and the aperture mask pattern are square.

35. The method of claim 33, wherein the repeating unit pattern and the aperture mask pattern have the same size.

36. The method of claim 32, wherein the repeating unit pattern is smaller than the aperture mask pattern.

37. The method of claim 32, wherein the aperture mask pattern includes a plurality of the repeating unit patterns.

* * * * *